United States Patent
Fan

(10) Patent No.: US 10,411,725 B2
(45) Date of Patent: Sep. 10, 2019

(54) ANALOG-TO-DIGITAL CONVERSION CIRCUIT AND METHOD

(71) Applicant: SHENZHEN GOODIX TECHNOLOGY CO., LTD., Shenzhen (CN)

(72) Inventor: Shuo Fan, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/168,774

(22) Filed: Oct. 23, 2018

(65) Prior Publication Data

US 2019/0058486 A1 Feb. 21, 2019

Related U.S. Application Data

(63) Continuation of application No. PCT/CN2017/078801, filed on Mar. 30, 2017.

(51) Int. Cl.
*H03M 1/46* (2006.01)
*H03M 1/12* (2006.01)
*H03M 1/00* (2006.01)

(52) U.S. Cl.
CPC .......... *H03M 1/466* (2013.01); *H03M 1/129* (2013.01); *H03M 1/1245* (2013.01); *H03M 1/002* (2013.01); *H03M 1/468* (2013.01)

(58) Field of Classification Search
CPC ..... H03M 1/466; H03M 1/1245; H03M 1/129
(Continued)

(56) References Cited

U.S. PATENT DOCUMENTS 5,283,583 A * 2/1994 Ichihara ................. H03M 1/44
341/127
6,313,780 B1 * 11/2001 Hughes ............... H03M 1/0682
341/120

(Continued)

FOREIGN PATENT DOCUMENTS

CN 103166644 A 6/2013
CN 103840829 A 6/2014
(Continued)

*Primary Examiner* — Lam T Mai

(57) ABSTRACT

An analog-to-digital conversion circuit and method are provided. At a sampling stage, the first capacitor array connects lower electrode plates of N capacitors to a first input voltage, connect lower electrode plates of the other capacitors to a common-mode voltage, and connect upper electrode plates of all the capacitors to the common-mode voltage to sample the first input voltage; in an $i^{th}$ conversion at a conversion stage, the logic circuit controls, the lower electrode plate of an $i^{th}$ capacitor to connect to a reference voltage or a ground voltage, a first comparison voltage output by the first capacitor array approximates a second comparison voltage; and the comparator stores a comparison result between the first and the second comparison voltage to an $i+1^{th}$ flag bit in the logic circuit, and analog-to-digital conversion is completed when i+1 is equal to the total number of capacitors in the first capacitor array.

16 Claims, 8 Drawing Sheets

(58) Field of Classification Search
USPC .................................................. 341/122–160
See application file for complete search history.

(56) References Cited

U.S. PATENT DOCUMENTS

| | | | |
|---|---|---|---|
| 6,473,021 B1 | 10/2002 | Somayajula et al. | |
| 6,731,232 B1 | 5/2004 | Kearney | |
| 7,773,024 B2 | 8/2010 | Ohnhauser et al. | |
| 8,860,600 B1 | 10/2014 | Yang | |
| 10,079,609 B2* | 9/2018 | Fan | H03M 1/002 |
| 10,270,459 B2* | 4/2019 | Fan | H03M 1/002 |
| 10,291,252 B1* | 5/2019 | Farid | H03M 1/462 |
| 2010/0079202 A1* | 4/2010 | Sugimoto | H03M 1/002 |
| | | | 327/544 |
| 2012/0112948 A1 | 5/2012 | Le Tual et al. | |
| 2017/0360315 A1* | 12/2017 | Pi | A61B 5/02427 |
| 2018/0076824 A1* | 3/2018 | Li | H03M 1/0678 |

FOREIGN PATENT DOCUMENTS

| | | |
|---|---|---|
| CN | 105811979 A | 7/2016 |
| CN | 105933007 A | 9/2016 |
| CN | 106301376 A | 1/2017 |

* cited by examiner

US 10,411,725 B2

ANALOG-TO-DIGITAL CONVERSION CIRCUIT AND METHOD

CROSS-REFERENCE TO RELATED APPLICATIONS

The present disclosure is a continuation of international application No. PCT/CN2017/078801 filed on Mar. 30, 2017, which is hereby incorporated by reference in its entireties.

TECHNICAL FIELD

The present application relates to the technical field of electronic circuits, and in particular, relates to an analog-to-digital conversion circuit and method.

BACKGROUND

Analog-to-digital conversion (ADC) is to convert a continuously varying analog quantity into a discrete digital quantity. For example, the analog quantity may be an analog signal, and the digital quantity may be a digital signal. According to the conversion manner, a successive approximation analog-to-digital converter, an integration analog-to-digital converter and a voltage-frequency conversion analog-to-digital converter may be used to perform analog-to-digital conversion. The successive approximation analog-to-digital converter (SAR ADC) has a medium conversion precision and a medium conversion speed. Practiced by the CMOS process, the SAR ADC ensures smaller chip area and lower power consumption, additionally implements multi-path conversions and thus has comprehensive advantages in the aspects of precision, speed, power consumption and cost. Therefore, the SAR ADC is extensively applied in industrial control, medical instruments, touch technology and the like fields.

The SAR ADC works under the following basic principles: comparing an analog input signal to be converted with an estimation signal, and determining whether to increase or decrease the estimation signal according to a comparison result, for approximation to the analog input signal. The estimation signal is obtained by an output of a digital/analog (D/A) converter. When the analog input signal is equal to the estimation signal, a digital signal input to the D/A converter is correspondingly a digital quantity of the analog signal.

A dynamic range of the ADC is a specific range in which the ADC is capable of correctly converting an input analog signal into a digital signal when the input analog signal is within this range.

In the prior art, the dynamic range of the SAR ADC is determined by a reference voltage thereof. For example, in a full differential SAR ADC, a positive reference voltage is Vrefp and a negative reference voltage is Vrefn, and then the dynamic range of the ADC is (Vrefp-Vrefn). To ensure that the input analog signal may be correctly converted, generally the range of the SAR ADC needs to be expanded, that is, the reference voltage needs to be increased. As a result, more power is inevitably consumed.

Therefore, how to expand a dynamic range of the ADC changing the value of the reference voltage is a technical problem to be urgently solved in the prior art.

SUMMARY

In view of the above, one of the technical problems to be solved by embodiments of the present application is to provide an analog-to-digital conversion circuit and method, to expand a dynamic range of the ADC without changing the value of a reference voltage.

Embodiments of the present application provide an analog-to-digital conversion circuit. The analog-to-digital conversion circuit includes a first capacitor array, a logic circuit and a comparator.

At a sampling stage, the first capacitor array is configured to connect lower electrode plates of N capacitors to a first input voltage, connect lower electrode plates of the other capacitors to a common-mode voltage, and connect upper electrode plates of all the capacitors to the common-mode voltage to sample the first input voltage, N being a positive integer less than the total number of capacitors.

In an $i^{th}$ conversion at a conversion stage, the logic circuit is configured to control, according to an $i^{th}$ stored flag bit, the lower electrode plate of an $i^{th}$ capacitor in the first capacitor array to connect to a reference voltage or a ground voltage, such that a first comparison voltage output by the first capacitor array approximates an analog voltage as a second comparison voltage, i being a positive integer less than the total number of capacitors.

The capacitor is configured to store a comparison result between the first comparison voltage and the second comparison voltage to an $i+1^{th}$ flag bit in the logic circuit, and analog-to-digital conversion is completed when i+1 is equal to the total number of capacitors in the first capacitor array.

Embodiments of the present application provide an analog-to-digital conversion method. The method includes:

at a sampling stage, connecting, by a first capacitor array, lower electrode plates of N capacitors to a first input voltage, connecting lower electrode plates of the other capacitors to a common-mode voltage, and connecting upper electrode plates of all the capacitors to the common-mode voltage to sample the first input voltage, N being a positive integer less than the total number of capacitors;

in an $i^{th}$ conversion at a conversion stage, controlling, by a logic circuit according to an $i^{th}$ stored flag bit, the lower electrode plate of an $i^{th}$ capacitor in the first capacitor array to connect to a reference voltage or a ground voltage, such that a first comparison voltage output by the first capacitor array approximates a second comparison voltage of a comparator, i being a positive integer less than the total number of capacitors; and storing, by the comparator, a comparison result between the first comparison voltage and the second comparison voltage to an $i+1^{th}$ flag bit in the logic circuit, and completing analog-to-digital conversion when i+1 is equal to the total number of capacitors in the first capacitor array.

As seen from the technical solutions according to the present application, at a sampling stage, lower electrode plates of a portion of capacitors in a first capacitor array are connected to a first input voltage, and upper electrodes of all the capacitors in the first capacitor array are connected to a common-mode voltage to sample the first input voltage; at a conversion stage, connections between the lower electrode plates of the capacitors in the first capacitor array and a reference voltage or a ground voltage are controlled one by one, such that a first comparison voltage approximates a second comparison voltage; and according to the charge conservation law, a charge amount at the sampling stage is equal to a charge amount at the conversion stage, that is, partial capacitance of the first capacitor voltage=(reference voltage−ground voltage)*all capacitance. Therefore, according to embodiments of the present application, a value range of the first input voltage is expanded, that is, a dynamic range of the ADC is expanded, without changing the value of the reference voltage.

BRIEF DESCRIPTION OF THE DRAWINGS

To more clearly describe technical solutions according to the embodiments of the present application or in the prior art, drawings that are to be referred for description of the embodiments or the prior art are briefly described hereinafter. Apparently, the drawings described hereinafter merely illustrate some embodiments of the present application. Persons of ordinary skill in the art may also derive other drawings based on the drawings described herein without any creative effort.

DETAILED DESCRIPTION

According to the present application, at a sampling stage, lower electrode plates of a portion of capacitors in a first capacitor array are connected to a first input voltage, and upper electrodes of all the capacitors in the first capacitor array are connected to a common-mode voltage to sample the first input voltage; at a conversion stage, connections between the lower electrode plates of the capacitors in the first capacitor array and a reference voltage or a ground voltage are controlled one by one, such that a first comparison voltage approximates a second comparison voltage; and according to the charge conservation law, a charge amount at the sampling stage is equal to a charge amount at the conversion stage, that is, partial capacitance of the first capacitor voltage=(reference voltage−ground voltage)*all capacitance. Therefore, according to embodiments of the present application, a value range of the first input voltage is expanded, that is, a dynamic range of the ADC is expanded, without changing the value of the reference voltage.

Nevertheless, it is not necessary to require that any technical solution according to the embodiments of the present application achieves all of the above technical effects.

To make the objectives, technical features, and advantages of the present application clearer and more understandable, the technical solutions according to the embodiments of the present application are further described in detail with reference to the accompany drawings. Apparently, the embodiments described herein are merely some exemplary ones, rather than all the embodiments of the present application. Based on the embodiments of the present application, all other embodiments derived by persons of ordinary skill in the art without any creative efforts shall fall within the protection scope of the present application.

Figure 1A:
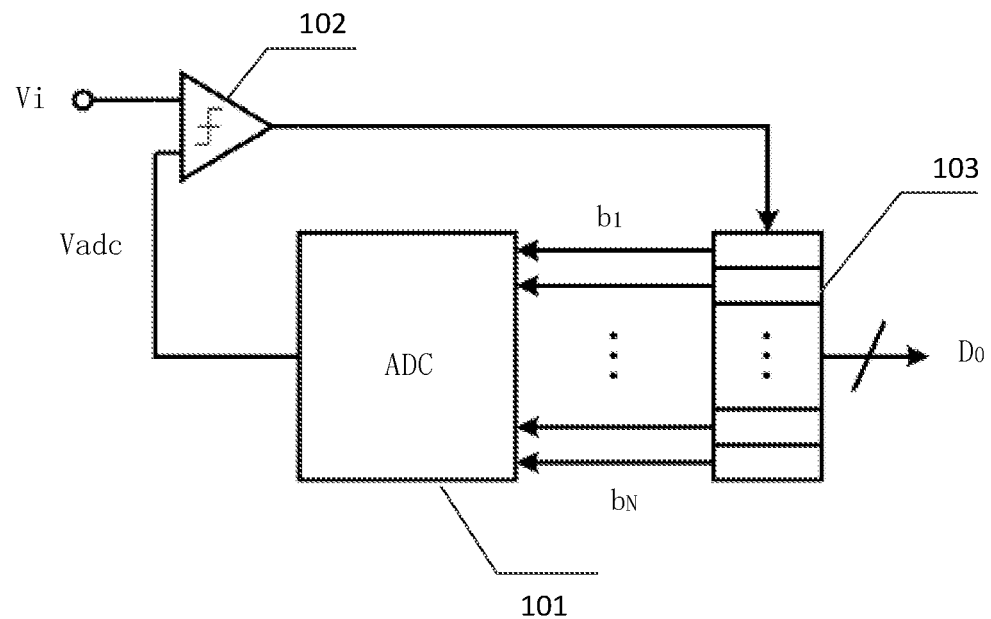
FIG. 1A is a schematic structural diagram of circuitry of a successive approximation analog-to-digital converter.

FIG. 1A is a schematic structural diagram of circuitry of a successive approximation analog-to-digital converter. As illustrated in FIG. 1A, a digital-to-analog converter 101, a comparator 102 and a logic circuit 103 are included.

The digital-to-analog converter 101 may supply an output voltage Vadc. An initial value of the output voltage Vadc may be defined according to a reference voltage Vref. The output voltage Vadc is used as a first comparison voltage of the comparator 102, and an input voltage Vi at the other terminal of the comparator 102 is used as a second comparison voltage. The comparator 102 acquires a comparison result between the first comparison voltage and a second comparison voltage. If Vi is greater than Vadc, the comparison result may be defined to 1; and otherwise, the comparison result is defined to 0.

The logic circuit 103 acquires and stores the comparison result. The number of comparisons for one analog-to-digital conversion is xx, and the digital-to-analog converter 101 adjusts the output voltage Vadc according to a previous comparison result, such that the output voltage Vadc approximates the input voltage Vi.

Figure 1B:
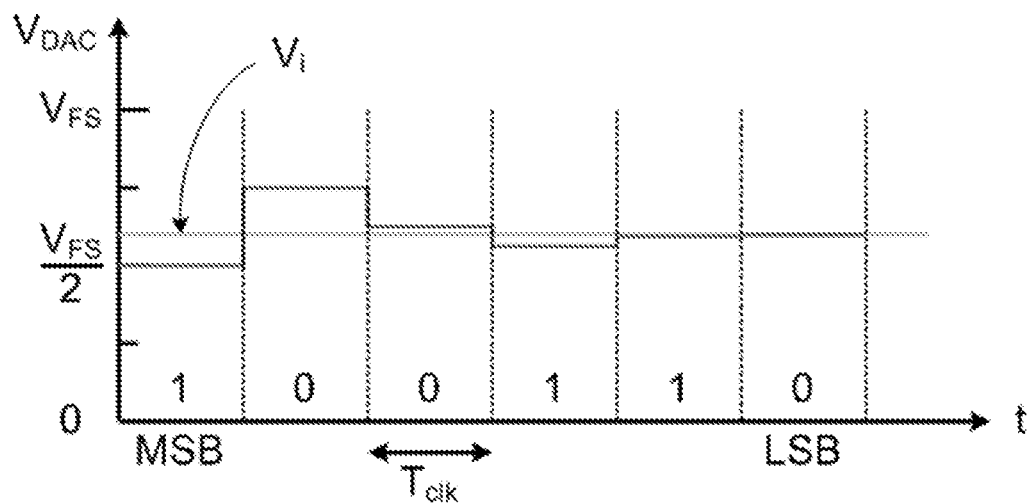
FIG. 1B is a schematic diagram of variations of an output voltage of a successive approximation analog-to-digital converter.

FIG. 1B is a schematic diagram of variations of an output voltage of a successive approximation analog-to-digital converter. As illustrated in FIG. 1B, the X axis of the coordinate system is time, and the unit is the time elapsed when the digital-to-analog converter 101 completes adjustment of the output voltage Vadc once; and the Y axis of the coordinate system is the output voltage Vadc of the comparator 102, and the unit is volt.

Specifically, the comparator 102 defines the output voltage Vadc to be half of a full scale voltage, that is, $V_{FS}/2$. The comparator 102 compares Vadc with the input voltage Vi, and adjusts Vadc according to the comparison result. For example, upon the first comparison, if the input voltage Vi is greater than Vadc, Vadc is adjusted to a common-mode voltage $(V_{FS}+V_{FS}/2)/2$ of $V_{FS}$ and $V_{FS}/2$, that is $3V_{FS}/4$; upon the second comparison, if the input voltage Vi is less than Vadc, Vadc is adjusted to a common-mode voltage $(V_{FS}/2+3V_{FS}/4)/2$ of $V_{FS}/2$ and $3V_{FS}/4$, that is, $5V_{FS}/8$; and the above steps are repeated until the adjustment is completed.

Optionally, the logic circuit 103 stores a first comparison result of the comparator 102 to a most significant bit (MSB), and stores a last comparison result of the comparator 102 to a least significant bit (LSB).

As seen from the above steps, after the output voltage Vadc of the digital-to-analog converter 101 is adjusted for i times, the precision in adjusting the output voltage by the digital-to-analog converter 101 is $V_{FS}/2^i$, that is, a difference between the output voltage Vadc and the input voltage Vi is within $V_{FS}/2^i$. For example, upon the first adjustment, the difference between the output voltage Vadc and the input voltage Vi is less than $V_{FS}/2$; upon the second adjustment, the difference between the output voltage Vadc and the input voltage Vi is less than $V_{FS}/4$; and upon the third adjustment, the difference between the output voltage Vadc and the input voltage Vi is less than $V_{FS}/8$, and so on.

Optionally, the full scale voltage VFS is the reference Vref.

Optionally, the logic circuit 103 is a shift register.

Figure 1C:
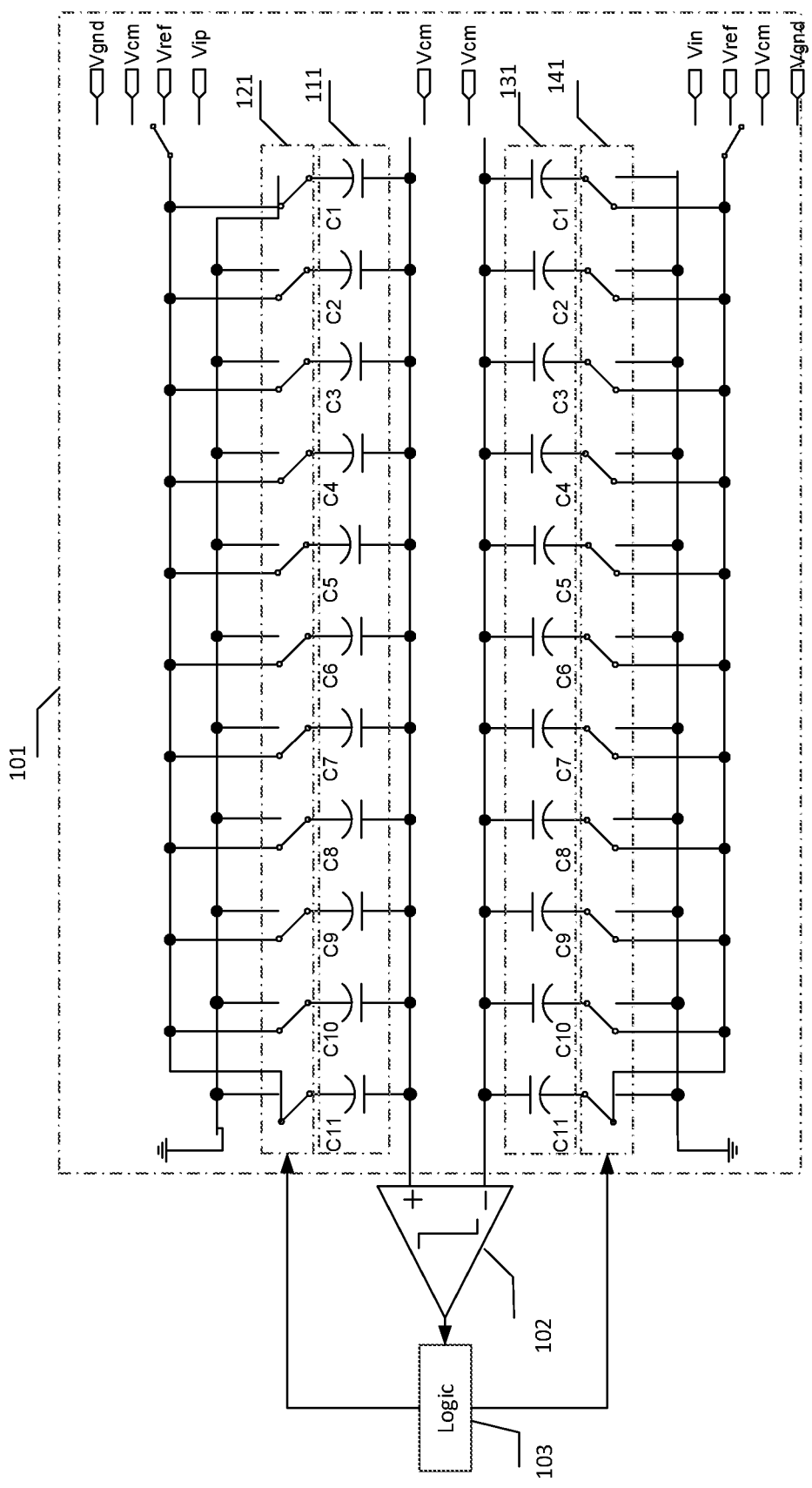
FIG. 1C is a schematic structural diagram of circuitry of a successive approximation analog-to-digital converter.

FIG. 1C is a schematic structural diagram of circuitry of a successive approximation analog-to-digital converter.

As illustrated in FIG. 1C, a digital-to-analog converter 101, a comparator 102 and a logic circuit 103 are included.

The digital-to-analog converter 101 includes a first capacitor array 111, a first switch array 121, a second capacitor array 131 and a second switch array 141.

Specifically, the first capacitor array 111 and the second capacitor array 131 are respectively connected to a positive input terminal and a negative input terminal of the comparator 102, to respectively supply a first comparison voltage and a second comparison voltage for the comparator 102; and the logic circuit 103 is configured to store a comparison result of the comparison, and control, according to the comparison result, switches in the first switch array 121 and the second switch array 141 to be turned on or turned off, such that the first comparison voltage approximates to the second comparison result. The detailed steps are as follows:

Sampling Stage

The first capacitor array 111 is configured to connect lower electrode plates of all the capacitors to a first input voltage Vip, and connect upper electrode plates of all the capacitors to a common-mode voltage Vcm to sample the first input voltage; and using capacitor C1 in the first capacitor array 111 as an example, an arc line side of capacitor C1 is the lower electrode plate, and a straight line side of capacitor C1 is the upper electrode plate.

Specifically, the first input voltage Vip may be a positive input voltage, that is, the input voltage Vi is used as the first input voltage Vip, to supply the first comparison voltage for the positive input terminal of the comparator 102.

Specifically, the sampling stage is a stage for charging the capacitors, and a charge amount in the first capacitor array 111 is:

$$(-Vip+Vcm)*(C1+C2+\ldots+C_M)$$

M is the number of capacitors in the first capacitor array 111, and FIG. 1C uses M=1 as an example.

The second capacitor array 131 is configured to connect lower electrode plates of all the capacitors to a second input voltage Vin, and connect upper electrode plates of all the capacitors in the second capacitor array 131 to a common-mode electrode Vcm to sample the second input voltage.

Specifically, the second input voltage Vin may be a negative input voltage, that is, the input voltage Vi is used as the second input voltage Vin, to supply the first comparison voltage for the negative input terminal of the comparator 102. At this stage, a charge amount in the first capacitor array 111 is:

$$(-Vin+Vcm)*(C1+C2+\ldots+C_M)$$

M is the number of capacitors in the first capacitor array 111, and FIG. 1C uses M=1 as an example.

Pre-Conversion Stage

The first capacitor array 111 is further configured to disconnect the upper electrode plates of all the capacitors from the common-mode voltage Vcm, and connect the lower electrode plates of all the capacitors to the common-mode voltage Vcm; and the upper electrode plates of all the capacitors in the first capacitor array 111 are connected to the comparator 102 to supply the first comparison voltage for the comparator. The first comparison voltage may be a voltage input to the positive input terminal of the comparator 102.

The second capacitor array 131 is further configured to disconnect the upper electrode plates of all the capacitors from the common-mode voltage Vcm, and connect the lower electrode plates of all the capacitors to the common-mode voltage Vcm; and the upper electrode plates of all the capacitors in the second capacitor array 131 are connected to the comparator 102 to supply the second comparison voltage for the comparator. The second comparison voltage may be a voltage input to the negative input terminal of the comparator.

The comparison result between the first comparison voltage and the second comparison voltage is stored to a first flag bit in the logic circuit 103. Optionally, the first flag bit is the most significant bit in the logic circuit 103.

Assume that the voltage of the upper electrode plate is Vx1, then a charge amount in the first capacitor array 111 is:

$$(Vx1-Vcm)*(C1+C2+\ldots+C_M)$$

According to the charge conservation law, the following equation may be obtained:

$$(-Vip+Vcm)*(C1+C2+\ldots+C_M)=(Vx1-Vcm)*(C1+C2+\ldots+C_M)$$

Conversion Stage

In an $i^{th}$ conversion at a conversion stage, the logic circuit is configured to control, according to an $i^{th}$ stored flag bit, the lower electrode plate of an $i^{th}$ capacitor in the first capacitor array to connect to a reference voltage or a ground voltage, such that a first comparison voltage output by the first capacitor array approximates a second comparison voltage, i being a positive integer less than the total number of capacitors.

Specifically, in the $i^{th}$ conversion at the conversion stage, the lower electrode plates of the capacitors (that is, the first to the i−1$^{th}$ capacitors, which are effective when i>1) before the $i^{th}$ capacitor in the first capacitor array 111 are connected to the reference voltage or the ground voltage, the lower electrode plates of the i+1$^{th}$ to the N$^{th}$ capacitors are connected to the common-mode voltage Vcm, the lower electrode plates of the i+1$^{th}$ to the N$^{th}$ capacitors are in a disconnected state, and the upper electrode plates of the first to the M$^{th}$ capacitors are connected to the positive input terminal of the comparator 102; the lower electrode plates of the capacitors (the first to the i−1th capacitors, which are effective when i>1) before the $i^{th}$ capacitor in the second capacitor array 131 are connected to the reference voltage or the ground voltage, the lower electrode plates of the i+1$^{th}$ to the N$^{th}$ capacitors are connected to the common-mode voltage Vcm, the lower electrode plates of the i+1$^{th}$ to the N$^{th}$ capacitors are in a disconnected state, and the upper electrode plates of the first to the M$^{th}$ capacitors are connected to the negative input terminal of the comparator 102.

The comparator 102 stores a comparison result between the first comparison voltage and the second comparison voltage to an i+1$^{th}$ flag bit in the logic circuit, and completes analog-to-digital conversion when i+1 is equal to the total number of capacitors in the first capacitor array.

For example, at this stage, after the comparator 102 performs the first comparison, if the first comparison voltage is greater than the second comparison voltage, an output result is 1, and in this case, the lower electrode plate is connected to Vgnd. Assume that the voltage of the upper electrode plate is Vx2, a charge amount in the first capacitor array 111 is:

$$(Vx2-Vgnd)C1+(Vx2-Vcm)*(C2+\ldots+C_M)$$

According to the charge conservation law, the following equation may be obtained:

$$(-Vip + Vcm) * (C1 + C2 + \ldots + C_M) =$$
$$(Vx2 - Vgnd)C1 + (Vx2 - Vcm) * (C2 + \ldots + C_M) =$$
$$(Vx2 - (Vcm - (Vref - Vgnd)/2)) * C1 + (Vx2 - Vcm) * (C2 + \ldots + C_M)$$

If the output result is 0, the lower electrode plate is connected to Vref. Assume that the voltage of the upper electrode plate is Vx2, a charge amount in the first capacitor array 111 is:

$$(Vx2-Vref)C1+(Vx2-Vcm)*(C2+\ldots+C_M)$$

According to the charge conservation law, the following equation may be obtained:

$$(-Vip + Vcm) * (C1 + C2 + \ldots + C_M) =$$
$$(Vx2 - Vref)C1 + (Vx2 - Vcm) * (C2 + \ldots + C_M) =$$
$$(Vx2 - (Vcm - (Vref - Vgnd)/2)) * C1 + (Vx2 - Vcm) * (C2 + \ldots + C_M)$$

The above two formulae are combined. Assume that the output result upon the first comparison is 1, variable D1=1, and when the output result is 0, D1=−1, and the following equation is obtained:

$$(-Vip+Vcm)*(C1+C2+\ldots+C_M)=(Vx2-(Vcm-D1(Vref-Vgnd)/2))*C1+(Vx2-Vcm)*(C2+\ldots+C_M)$$

Analogously, upon completion of the last comparison, the following equation is obtained:

$$(-Vip+Vcm)*(C1+C2+\ldots+C_M)=(Vx-(Vcm-D1*(Vref-Vgnd)/2))*C1+(Vx-(Vcm-D2*(Vref-Vgnd)/2))*C2+\ldots+(Vx-(Vcm-D_M*(Vref-Vgnd)/2))*C_M$$

The control over the second capacitor array 131 by the logic circuit 103 is contrary to the control over the first capacitor array 111, which is thus not described herein any further. Then the following equation may be obtained:

$$(-Vin+Vcm)*(C1+C2+\ldots+C_M)=(Vy-(Vcm-D1*(Vref-Vgnd)/2))*C1+(Vy-(Vcm-D2*(Vref-Vgnd)/2))*C2+\ldots+(Vy-(Vcm-D_M*(Vref-Vgnd)/2))*C_M$$

Specifically, Vin may be a negative input voltage.

Upon completion of the last comparison, voltages at two terminals of the comparator 102 are equal or an error therebetween falls within a specific error range. In this case, Vx=Vy. Then the following equation may be obtained:

$$(Vip-Vin)=-(D1*C1+D2*C2+\ldots+D_M*C_M)*(Vref-Vgnd)/(C1+C2+\ldots+C_M)$$

Since D1 to D11 take a value of −1 or 1, a value range of Vip−Vin may be obtained.

$$-(Vref-Vgnd)<=Vip-Vin<=Vref-Vgnd$$

That is, the value range of Vip−Vin is [−(Vref−Vgnd), Vref−Vgnd].

Figure 2:
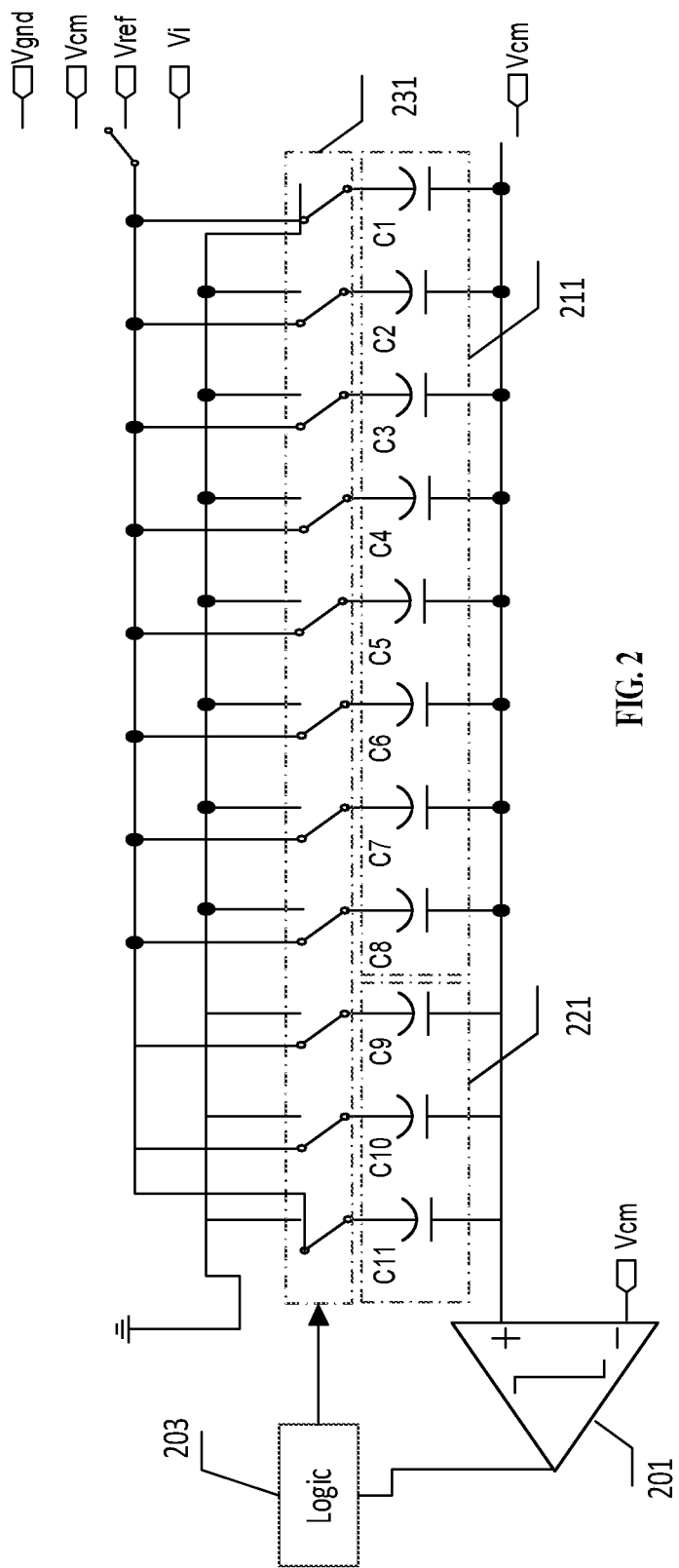
FIG. 2 is a schematic structural diagram of circuitry of a successive approximation analog-to-digital converter according to an embodiment of the present application.

FIG. 2 is a schematic structural diagram of circuitry of a successive approximation analog-to-digital converter according to an embodiment of the present application. As illustrated in FIG. 2, the circuit includes a digital-to-analog converter (not illustrated in the drawing), a comparator 202 and a logic circuit 203. The digital-to-analog converter includes a first capacitor array 211 and a switch array 221.

Hereinafter, the circuit according to this embodiment is described according to a sequence of a sampling state, a pre-conversion stage and a conversion stage.

Sampling Stage

The first capacitor array 211 is configured to connect lower electrode plates of N capacitors to a first input voltage Vip, and connect lower electrode plates of the other capacitors to a common-mode voltage Vcm; and upper electrode plates of all the capacitors in the first capacitor array 211 are connected to the common-mode voltage Vcm to sample the first input voltage. N is a positive integer less than the number M of capacitors. Using FIG. 2 as an example, N=8 and M=11. Specifically, the sampling stage is a stage for charging the capacitors, and a charge amount in the first capacitor array 211 is:

$$(-Vi+Vcm)*(C1+C2+\ldots+C_N)$$

Pre-Conversion Stage

The first capacitor array 211 is further configured to disconnect the upper electrode plates of all the capacitors from the common-mode voltage Vcm, connect the lower electrode plates of all the capacitors to the common-mode voltage Vcm, and connect the upper electrode plates of all the capacitors to the comparator 202 to supply the first comparison voltage for the comparator. The first comparison voltage may be a voltage input to the positive input terminal of the comparator 202.

Specifically, the negative input terminal of the comparator 202 is connected to the common-mode voltage Vcm.

The comparator 202 stores the comparison result between the first comparison voltage and the second comparison voltage to the first flag bit in the logic circuit 203. Optionally, the first flag bit is the most significant bit in the logic circuit 103.

Assume that the voltage of the upper electrode plate is Vx1, and the number of capacitors in the first capacitor array 211 is M, then a charge amount in the first capacitor array 211 is:

$$(Vx1-Vcm)*(C1+C2+\ldots+C_M)$$

According to the charge conservation law, the following equation may be obtained:

$$(-Vi+Vcm)*(C1+C2+\ldots+C_N)=(Vx1-Vcm)*(C1+C2+\ldots+C_M)$$

Conversion Stage

In an $i^{th}$ conversion, the logic circuit controls, according to an $i^{th}$ stored flag bit, the lower electrode plate of an $i^{th}$ capacitor in the first capacitor array to connect to a reference voltage or a ground voltage, such that a first comparison voltage output by the first capacitor array approximates a second comparison voltage. i is a positive integer less than the total number of capacitors.

Specifically, in the $i^{th}$ conversion at the conversion stage, the states of the other capacitors are as follows: the lower electrode plates of the capacitors (that is, the first to the i-1$^{th}$ capacitors, which are effective when i>1) before the $i^{th}$ capacitor in the first capacitor array 211 are connected to the reference voltage or the ground voltage, the lower electrode plates of the i+1$^{th}$ to the N$^{th}$ capacitors are connected to the common-mode voltage Vcm, the lower electrode plates of the i+1$^{th}$ to the N$^{th}$ capacitors are in a disconnected state, and the upper electrode plates of the first to the M$^{th}$ capacitors are connected to the positive input terminal of the comparator 102; the lower electrode plates of the capacitors (the first to the i−1$^{th}$ capacitors, which are effective when i>1) before the i$^{th}$ capacitor in the second capacitor array 231 are connected to the reference voltage or the ground voltage, the lower electrode plates of the i+1$^{th}$ to the N$^{th}$ capacitors are connected to the common-mode voltage Vcm, the lower electrode plates of the i+1$^{th}$ to the N$^{th}$ capacitors are in a disconnected state, and the upper electrode plates of the first to the M$^{th}$ capacitors are connected to the negative input terminal of the comparator 202.

The comparator stores a comparison result between the first comparison voltage and the second comparison voltage to an i+1$^{th}$ flag bit of the logic circuit, and completing analog-to-digital conversion when i+1 is equal to the total number of capacitors in the first capacitor array.

Specifically, in this embodiment, the flag bit stored in the logic circuit takes a value of 0 or 1. For example, if the first voltage is greater than the second voltage in the i$^{th}$ comparison, the i$^{th}$ flag bit is 1; and if the first voltage is less than the second voltage in the i$^{th}$ comparison, the i$^{th}$ flag bit is 0.

If the i$^{th}$ flag bit is 1, the lower electrode plate of the i$^{th}$ capacitor in the first capacitor array 311 is connected to the ground voltage, and the lower electrode plate of the i$^{th}$ capacitor in the second capacitor array 331 is connected to the reference voltage.

Specifically, in this embodiment, the controlling, according to the flag bit, the lower electrode plate of the i$^{th}$ capacitor in the first capacitor array 211 to connect to the reference voltage or the ground voltage, such that the first comparison voltage approximates the second comparison voltage includes:

if the flag bit is 1, connecting the lower electrode plate of the i$^{th}$ capacitor in the first capacitor array 211 to the ground voltage; and otherwise, connecting the lower electrode plate of the i$^{th}$ capacitor in the first capacitor array 211 to the reference voltage.

Specifically, in this embodiment, the acquiring, by the comparator, a comparison result between the first comparison voltage and the second comparison voltage, and using the comparison result as a flag bit and storing the same to the i+1$^{th}$ bit in the logic circuit includes:

if the first comparison voltage is greater than the second comparison voltage, defining the comparison result to 1, and otherwise, defining the comparison result to 0; and storing the comparison result as a flag bit to the i+1$^{th}$ bit in the logic circuit.

Specifically, in this embodiment, the common-mode voltage Vcm is an average value of the reference voltage Vref and the ground voltage Vgnd, that is, Vcm=(Vref+Vgnd)/2.

For example, at this stage, after the comparator performs the first comparison, if the output result is 1, assume that the voltage of the upper electrode plate is Vx2 and the lower electrode plate is connected to Vgnd, then a charge amount in the first capacitor array 211 is:

$$(V_{x2}-V_{gnd})C1+(V_{x2}-Vcm)*(C_2+\ldots+C_M)$$

According to the charge conservation law, the following equation may be obtained:

$$(-Vi+VCM)*(C1+C2+\ldots+C_N) =$$
$$(Vx2-Vgnd)C1+(Vx2-Vcm)*(C2+\ldots+C_M) =$$
$$(Vx2-(Vcm-(Vref-Vgnd)/2))*C1+(Vx2-Vcm)*(C2+\ldots+C_M)$$

If the output result is 0, assume that the voltage of the upper electrode plate is Vx2, and the lower electrode plate is connected to Vref, then a charge amount in the first capacitor array 211 is:

$$(Vx2-Vref)C1+(Vx2-Vcm)*(C2+\ldots+C_M)$$

According to the charge conservation law:

$$(-Vi+Vcm)*(C1+C2+\ldots+C_N) =$$
$$(Vx2-Vref)C1+(Vx2-Vcm)*(C2+\ldots+C_M) =$$
$$(Vx2-(Vcm+(Vref-Vgnd)/2))*C1+(Vx2-Vcm)*(C2+\ldots+C_M)$$

The above two formulae are combined. Assume that the output result upon the first comparison is 1, variable D1=1, and when the output result is 0, D1=−1, and the following equation is obtained:

$$(-Vi+Vcm)*(C1+C2+\ldots+C_M)=(Vx2-(Vcm-D1(Vref-Vgnd)/2))*C1+(Vx2-Vcm)*(C2+\ldots+C_M)$$

Analogously, upon completion of the last comparison, the following equation is obtained:

$$(-Vi+Vcm)*(C1+C2+\ldots+C_N)=(Vx-(Vcm-D1*(Vref-Vgnd)/2))*C1+(Vx-(Vcm-D2*(Vref-Vgnd)/2))*C2+\ldots+(Vx-(Vcm-D_M*(Vref-Vgnd)/2))*C_M$$

Upon completion of the last comparison, voltages at two terminals of the comparator 202 are equal or an error therebetween falls within a specific error range. In this case, it is determined that Vx=Vy. Then the following equation may be obtained:

$$(-Vi+Vcm)*(C1+C2+\ldots+C_N)=(Vref-Vgnd)/2)*(D1*C1+D2*C2+\ldots+D_M*C_M)$$

Upon simplification, the following equation is obtained:

$$Vi = \frac{Vref+Vgnd}{2} - \frac{D1*C1+D2*C2+\ldots+D_M*C_M}{C1+C2+\ldots+C_N} * \frac{Vref-Vgnd}{2}$$

Since D1 to DN take a value of −1 or 1, when the values of D1 to DN are all 1, Vi takes a minimum value of:

$$\frac{Vref+Vgnd}{2} - \frac{C1+C2+\ldots+C_M}{C1+C2+\ldots+C_N} * \frac{Vref-Vgnd}{2}$$

Since N<M and (C1+C2+ . . . +C$_M$)/(C1+C2+ . . . +C$_N$) is greater than 1, it is known that the minimum value of Vi is less than Vgnd.

When the values of D1 to DN are all −1, Vi takes a maximum value of:

$$\frac{Vref+Vgnd}{2} + \frac{C1+C2+\ldots+C_M}{C1+C2+\ldots+C_N} * \frac{Vref-Vgnd}{2}$$

Since N<M and (C1+C2+ . . . +C$_M$)/(C1+C2+ . . . +C$_N$) is greater than 1, it is known that the maximum value of Vi is greater than Vref.

Accordingly, the value range of Vi is greater than [Vgnd, Vref], that is, the dynamic range of the ADC has been expanded.

Specifically, in this embodiment, the logic circuit is a shift register.

Specifically, in this embodiment, the value of N is defined according to a value range of the first input voltage. For example, when the reference voltage Vref is fixed and the total number of capacitors in the capacitor array is fixed, a greater value of N indicates a smaller value range of the first input voltage; and on the contrary, a smaller value of N indicates a greater value range of the first input voltage. N may be defined according to the actual application, and is not changed at the conversion stage.

Specifically, in this embodiment, the N capacitors selected from all the capacitors (M capacitors) in the first capacitor array 211 may be non-contiguous.

Specifically, in this embodiment, in the $i^{th}$ conversion at the conversion stage, a capacitor is randomly selected from the capacitors (the capacitors that are not converted in the N capacitors) whose lower electrode plates are connected to the common-mode voltage Vcm in the first capacitor array 211 for conversion.

Specifically, in this embodiment, each capacitor in the first capacitor array 211 is formed by a plurality of capacitor cells connected in series or in parallel, and the capacitor cells corresponding to each capacitor are in a binary arrangement or a non-binary arrangement. For example, in the above embodiment, capacitor C1 may be formed by $2^5$ (that is, 32) capacitor cells connected in parallel, and all the capacitor cells are in the binary arrangement, analog-to-digital conversion may be quickly completed by using the binary search method which has the advantages of quick operation, high efficiency and the like. Still for example, in the above embodiment, capacitor C1 may be formed by 31 capacitors connected in parallel, all the capacitor cells are in the non-binary arrangement, when the capacitor cells are operated, the capacitors cells are operated one by one, which has the advantages of good fault tolerance, low power consumption and the like. For example, when a bit of the comparator encounters a fault, the following capacitor cells may be adjusted to ensure accuracy of an analog-to-digital conversion result.

Specifically, the embodiment of the present application may be applied to a single-end ADC.

According to the embodiment of the present application, the value range of the first input voltage is expanded, that is, the dynamic range of the ADC is expanded, without changing the value of the reference voltage.

Figure 3:
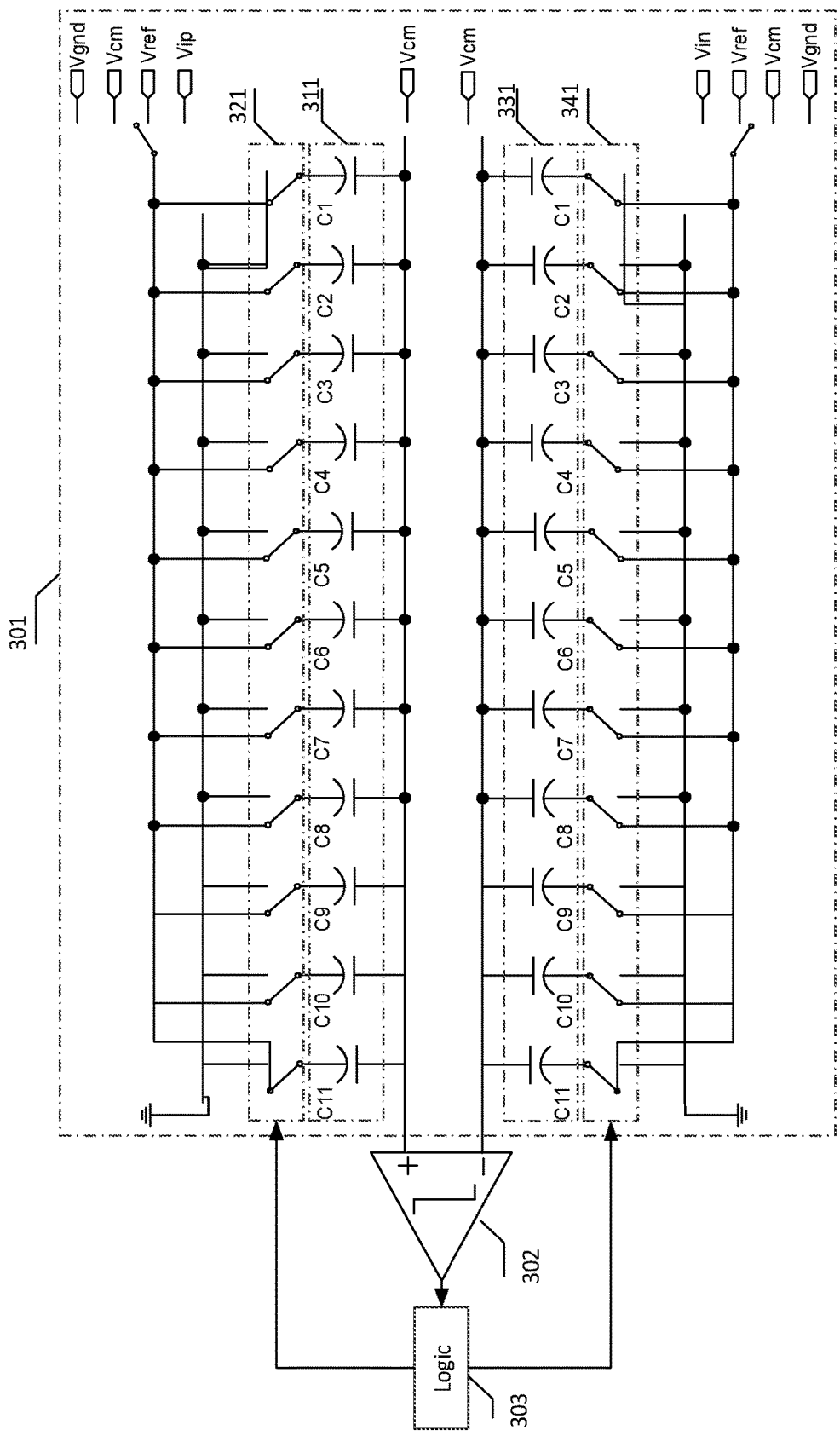
FIG. 3 is a schematic structural diagram of circuitry of another successive approximation analog-to-digital converter according to an embodiment of the present application.

FIG. 3 is a schematic structural diagram of circuitry of a successive approximation analog-to-digital converter. As illustrated in FIG. 3, a digital-to-analog converter 301, a comparator 302 and a logic circuit 303 are included. The digital-to-analog converter 301 includes a first capacitor array 311, a first switch array 321, a second capacitor array 331 and a second switch array 341.

Sampling Stage

The first capacitor array 311 is configured to connect lower electrode plates of N capacitors to a first input voltage Vip, and connect lower electrode plates of the other capacitors to a common-mode voltage Vcm; and upper electrode plates of all the capacitors in the first capacitor array 311 are connected to the common-mode voltage Vcm to sample the first input voltage. N is a positive integer less than the number M of capacitors. Using FIG. 3 as an example, N=8 and M=11. Specifically, the sampling stage is a stage for charging the capacitors, and a charge amount in the first capacitor array 311 is:

$(-Vip+Vcm)*(C1+C2+ \ldots +C_N)$

The second capacitor array 331 is configured to connect lower electrode plates of N capacitors to a second input voltage Vin, and connect lower electrode plates of the other capacitors to a common-mode voltage Vcm; and upper electrode plates of all the capacitors in the second capacitor array 331 are connected to the common-mode voltage Vcm to sample the second input voltage.

Specifically, in this embodiment, a difference between the first input voltage Vip and the second input voltage Vin may correspond to the input voltage Vi in the embodiment as illustrated in FIG. 1A, that is, Vi=Vip−Vin.

At the sampling stage, a charge amount in the second capacitor array 311 is:

$(-Vin+Vcm)*(C1+C2+ \ldots +C_N)$

Pre-Conversion Stage

The first capacitor array 311 is further configured to disconnect the upper electrode plates of all the capacitors from the common-mode voltage Vcm, and connect the lower electrode plates of all the capacitors to the common-mode voltage Vcm; and the upper electrode plates of all the capacitors in the first capacitor array 311 are connected to the comparator 302 to supply a first comparison voltage for the comparator. The first comparison voltage may be a voltage input to the positive input terminal of the comparator 202.

The second capacitor array 331 is further configured to disconnect the upper electrode plates of all the capacitors from the common-mode voltage Vcm, and connect the lower electrode plates of all the capacitors to the common-mode voltage Vcm; and the upper electrode plates of all the capacitors in the second capacitor array 331 are connected to the comparator 302 to supply a second comparison voltage for the comparator. The second comparison voltage may be a voltage input to the negative input terminal of the comparator 302.

In this embodiment, the comparison result between the first comparison voltage and the second comparison voltage is stored to a first flag bit of the logic circuit 303. Optionally, the first flag bit is the most significant bit in the logic circuit 103.

Assume that the voltage of the upper electrode plate is Vx1, and the number of capacitors in the first capacitor array 311 is M, then a charge amount in the first capacitor array 311 is:

$(Vx1-Vcm)*(C1+C2+ \ldots +C_M)$

According to the charge conservation law, the following equation may be obtained:

$(-Vip+Vcm)*(C1+C2+ \ldots +C_N)=(Vx1-Vcm)*(C1+C2+ \ldots +C_M)$

Conversion Stage

In an $i^{th}$ conversion at a conversion stage, the logic circuit 303 is configured to control, according to an $i^{th}$ stored flag bit, the lower electrode plate of an $i^{th}$ capacitor in the first capacitor array 311 to connect to a reference voltage or a ground voltage, such that a first comparison voltage output by the first capacitor array 311 approximates a second comparison voltage, i being a positive integer less than the total number of capacitors.

Further, the logic circuit is configured to control, according to the $i^{th}$ stored flag bit, the lower electrode plate of an $i^{th}$ capacitor in the second capacitor array to connect to a reference voltage or a ground voltage, such that the second comparison voltage output by the second capacitor array 331 approximates the first comparison voltage.

Specifically, in this embodiment, the flag bit stored in the logic circuit takes a value of 0 or 1. For example, if the first comparison voltage is greater than the second comparison voltage in the $i^{th}$ comparison, the $i^{th}$ flag bit is 1; and if the first comparison voltage is less than the second comparison voltage in the $i^{th}$ comparison, the $i^{th}$ flag bit is 0.

If the $i^{th}$ flag bit is 1, the lower electrode plate of the $i^{th}$ capacitor in the first capacitor array 311 is connected to the ground voltage, and the lower electrode plate of the $i^{th}$ capacitor in the second capacitor array is connected to the reference voltage; and if the flag bit is 0, the lower electrode plate of the $i^{th}$ capacitor in the first capacitor array 311 is connected to the reference voltage, and the lower electrode plate of the $i^{th}$ capacitor in the second capacitor array 331 is connected to the ground voltage.

It should be understood that in this embodiment, details elaborating that the value of the flag bit is 0 or 1 and the connections between the capacitors in the first capacitor array 311 and the second capacitor array 331 is controlled according to the flag bit are intended to illustrate generic principles of the present application, instead of limiting the scope of the present application. In some other embodiments, one capacitor array may obtain a value of the flag bit that is inversed, and may control the connections between the capacitors in the capacitor array according to the inversed value. For example, the second capacitor array 331 obtains the value of the flag bit that is inversed, when the value of the $i^{th}$ flag bit that is inversed is 1, the lower electrode plate of the $i^{th}$ capacitor in the second capacitor array 331 is connected to the ground voltage; and when the value of the $i^{th}$ flag bit that is inversed is 0, the lower electrode plate of the $i^{th}$ capacitor in the second capacitor array 331 is connected to the reference voltage.

Specifically, in the $i^{th}$ conversion at the conversion stage, the states of the other capacitors are as follows: the lower electrode plates of the capacitors (that is, the first to the i–$1^{th}$ capacitors, which are effective when i>1) before the $i^{th}$ capacitor in the first capacitor array 311 are connected to the reference voltage or the ground voltage, the lower electrode plates of the i+$1^{th}$ to the $N^{th}$ capacitors are connected to the common-mode voltage Vcm, the lower electrode plates of the i+$1^{th}$ to the $N^{th}$ capacitors are in a disconnected state, and the upper electrode plates of the first to the $M^{th}$ capacitors are connected to the positive input terminal of the comparator 102; the lower electrode plates of the capacitors (the first to the i–$1^{th}$ capacitors, which are effective when i>1) before the $i^{th}$ capacitor in the second capacitor array 331 are connected to the reference voltage or the ground voltage, the lower electrode plates of the i+$1^{th}$ to the $N^{th}$ capacitors are connected to the common-mode voltage Vcm, the lower electrode plates of the i+$1^{th}$ to the $N^{th}$ capacitors are in a disconnected state, and the upper electrode plates of the first to the $M^{th}$ capacitors are connected to the negative input terminal of the comparator 302.

The comparator stores a comparison result between the first comparison voltage and the second comparison voltage to an i+$1^{th}$ flag bit of the logic circuit, and completing analog-to-digital conversion when i+1 is equal to the total number of capacitors in the first capacitor array.

Similar to the formula derivation process in the embodiment as illustrated in FIG. 2, upon completion of the last comparison, based on the charge conservation law of the first capacitor array, the following equation may be obtained:

$$(-Vip+Vcm)*(C1+C2+\ldots+C_N)=(Vx-(Vcm-D1*(Vref-Vgnd)/2))*C1+(Vx-(Vcm-D2*(Vref-Vgnd)/2))*C2+\ldots+(Vx-(Vcm-D_M*(Vref-Vgnd)/2))*C_M$$

According to the charge conservation law of the second capacitor array, the following equation may be obtained:

$$(-Vin+Vcm)*(C1+C2++C_N)=(Vy-(Vcm-D1*(Vref-Vgnd)/2))*C1+(Vy-(Vcm-D2*(Vref-Vgnd)/2))*C2+\ldots+(Vy-(Vcm-D_M*(Vref-Vgnd)/2))*C_M$$

Optionally, Vip is a positive input voltage, and Vin is a negative input voltage.

Upon completion of the last comparison, voltages at two terminals of the comparator 302 are equal or an error therebetween falls within a specific error range. In this case, Vx=Vy. Then the following equation may be obtained $$(Vip-Vin)=-(D1*C1+D2*C2+\ldots+D_N*C_N)*(Vref-Vgnd)/(C1+C2+\ldots+C_M)$$

Since D1 to $D_N$ take a value of –1 or 1, when the values of D1 to $D_N$ are all 1, Vi takes a minimum value of $-(C1+C2+\ldots+C_N)*(Vref-Vgnd)/(C1+C2+\ldots+C_M)$.

Since N<M, it is known that the minimum value of (Vip–Vin) is less than –(Vref–Vgnd).

When the values of D1 to $D_N$ are all –1, (Vip–Vin) takes a maximum value of $(C1+C2+\ldots+C_N)*(Vref-Vgnd)/(C1+C2+\ldots+C_M)$.

Since N<M, it is known that the maximum value of (Vip–Vin) is greater than (Vref–Vgnd).

Accordingly, the value range of Vip–Vin is greater than [–(Vref–Vgnd), Vref–Vgnd], that is, the dynamic range of the ADC has been expanded.

Specifically, the embodiment of the present application may be applied to a differential ADC.

According to the embodiment of the present application, the value range of the first input voltage is expanded, that is, the dynamic range of the ADC is expanded, without changing the value of the reference voltage. In addition, the circuit according to the embodiment of the present application has a simple structure, with no need to arrange an additional switch, which is thus simple to practice.

Figure 4:
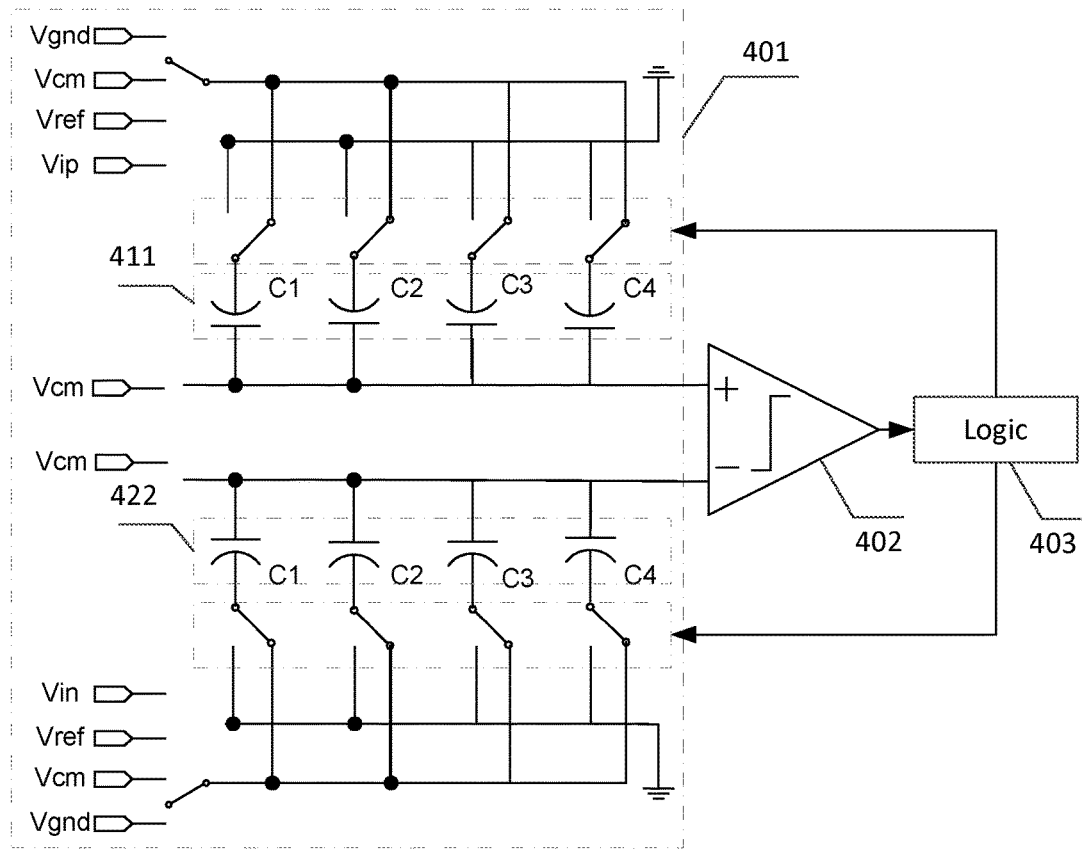
FIG. 4 is a schematic structural diagram of circuitry of another successive approximation analog-to-digital converter according to an embodiment of the present application.

FIG. 4 is a schematic structural diagram of circuitry of a successive approximation analog-to-digital converter. As illustrated in FIG. 4, a digital-to-analog converter 401, a comparator 402 and a logic circuit 403 are included. The digital-to-analog converter 401 includes a first capacitor array 411 and a second capacitor array 421.

The capacitors in the first capacitor array 411 are as follows: C1=4C, C2=2C, C3=1C and C4=1C, the capacitances of the capacitors in the second capacitor array 421 are the same as those in the first capacitor array 411, C1=4C, C2=2C, C3=1C and C4=1C. Assume that a reference voltage Vref takes a value of 1.8 V, a ground voltage Vgnd takes a value of 0.2 V, a common-mode voltage Vcm takes a value of 1 V, a first input voltage Vip takes a value of 1.9 V, and a second input voltage takes a value of 0.1 V.

Sampling Stage

Capacitors C1 and C2 in the first capacitor array 411 are sampled, and capacitors C3 and C3 are not involved in the sampling. That is, the lower electrode plates of capacitors C1 and C2 are connected to the first input voltage Vip, the lower electrode plates of capacitors C3 and C4 are connected to the common-mode voltage Vcm, the upper electrode plates of capacitors C1, C2, C3 and C4 are connected to the common-mode voltage Vcm. In this case, a charge amount in the first capacitor array 411 is:

$$(-Vip+Vcm)(C1+C2)=(-1.9+1)*6C=-0.9*6C$$

Capacitors C1 and C2 in the first capacitor array 411 are sampled, and capacitors C3 and C3 are not involved in the sampling. That is, the lower electrode plates of capacitors C1 and C2 are connected to the first input voltage Vip, the lower electrode plates of capacitors C3 and C4 are connected to the common-mode voltage Vcm, the upper electrode plates of capacitors C1, C2, C3 and C4 are connected to the common-mode voltage Vcm. In this case, a charge amount in the second capacitor array 421 is:

$$(-Vin+Vcm)(C1+C2)=(-0.1+1)*6C=0.9*6C$$

Pre-Conversion Stage

In the first capacitor array 411, the upper electrode plates of capacitors C1, C2, C3 and C4 are disconnected from the common-mode voltage Vcm, the lower electrode plates of capacitors C1, C2, C3 and C4 are connected to the common-mode voltage, and the upper electrode plates of capacitors C1, C2, C3 and C4 are connected to a positive comparison terminal of the comparator 402. Assume that an input voltage at the positive comparison terminal of the comparator 402 is Vx1, according to the charge conservation law, the following equation may be obtained:

$$(-Vip+Vcm)(C1+C2)=(Vx1-Vcm)*(C1+C2+C3+C4)$$

It is solved that Vx1=0.325 V.

In the second capacitor array 421, the upper electrode plates of capacitors C1, C2, C3 and C4 are disconnected from the common-mode voltage Vcm, the lower electrode plates of capacitors C1, C2, C3 and C4 are connected to the common-mode voltage, and the upper electrode plates of capacitors C1, C2, C3 and C4 are connected to a negative comparison terminal of the comparator 402. Assume that an input voltage at the negative comparison terminal of the comparator 402 is Vy1, according to the charge conservation law, the following equation may be obtained:

$$(-Vin+Vcm)(C1+C2)=(Vy1-Vcm)*(C1+C2+C3+C4)$$

It is solved that Vy1=1.625 V.

Since Vx1<Vy1, the comparator 402 outputs 0, and stores 0 to the first flag bit in the logic circuit 403.

Conversion Stage

In the first conversion, since the first flag bit in the logic circuit 403 is 0, the lower electrode plate of the first capacitor C1 in the first capacitor array 411 is connected to the reference voltage Vref, and the lower electrode plate of the first capacitor C1 in the second capacitor array 421 is connected to the ground voltage Vgnd. Assume that an input voltage at the positive comparison terminal of the comparator 402 is Vx2, according to the charge conservation law, the following equation may be obtained:

$$(-Vip+Vcm)(C1+C2)=(Vx2-Vref)*C1+(Vx2-Vcm)*(C2+C3+C4)$$

It is solved that Vx2=0.725 V.

Assume that an input voltage at the positive comparison terminal of the comparator 402 is Vy2, according to the charge conservation law, the following equation may be obtained:

$$(-Vin+Vcm)(C1+C2)=(Vy2-Vgnd)*C1+(Vy2-Vcm)*(C2+C3+C4)$$

It is solved that Vy2=1.125 V.

Since Vx2<Vy2, the comparator 402 outputs 0, and stores 0 to the second flag bit in the logic circuit 403.

In the second conversion, since the second flag bit in the logic circuit 403 is 0, the lower electrode plate of the second capacitor C2 in the first capacitor array 411 is connected to the reference voltage Vref, and the lower electrode plate of the second capacitor C2 in the second capacitor array 421 is connected to the ground voltage Vgnd. Assume that an input voltage at the positive comparison terminal of the comparator 402 is Vx3, according to the charge conservation law, the following equation may be obtained:

$$(-Vip+Vcm)(C1+C2)=(Vx3-Vref)*(C1+C2)+(Vx3-Vcm)*(C3+C4)$$

It is solved that Vx3=0.925 V.

Assume that an input voltage at the positive comparison terminal of the comparator 402 is Vy3, according to the charge conservation law, the following equation may be obtained:

$$(-Vin+Vcm)(C1+C2)=(Vy3-Vgnd)*(C1+C2)+(Vy3-Vcm)*(C3+C4)$$

It is solved that Vy3=1.025 V.

Since Vx3<Vy3, the comparator 402 outputs 0, and stores 0 to the third flag bit in the logic circuit 403.

In the third conversion, since the third flag bit in the logic circuit 403 is 0, the lower electrode plate of the third capacitor C3 in the first capacitor array 411 is connected to the reference voltage Vref, and the lower electrode plate of the third capacitor C3 in the second capacitor array 421 is connected to the ground voltage Vgnd. Assume that an input voltage at the positive comparison terminal of the comparator 402 is Vx4, according to the charge conservation law, the following equation may be obtained:

$$(-Vip+Vcm)(C1+C2)=(Vx4-Vref)*(C1+C2+C3)+(Vx4-Vcm)*(C4)$$

It is solved that Vx4=1.025 V.

Assume that an input voltage at the positive comparison terminal of the comparator 402 is Vy4, according to the charge conservation law, the following equation may be obtained:

$$(-Vin+Vcm)(C1+C2)=(Vy4-Vgnd)*(C1+C2+C3)+(Vy3-Vcm)*(C4)$$

It is solved that Vy4=0.925 V.

Since Vx4>Vy4, the comparator 402 outputs 1, and stores 1 to the fourth flag bit in the logic circuit 403.

In this case, 4-bit full differential SAR ADC conversion is completed, an output signal is 0001.

Figure 5:
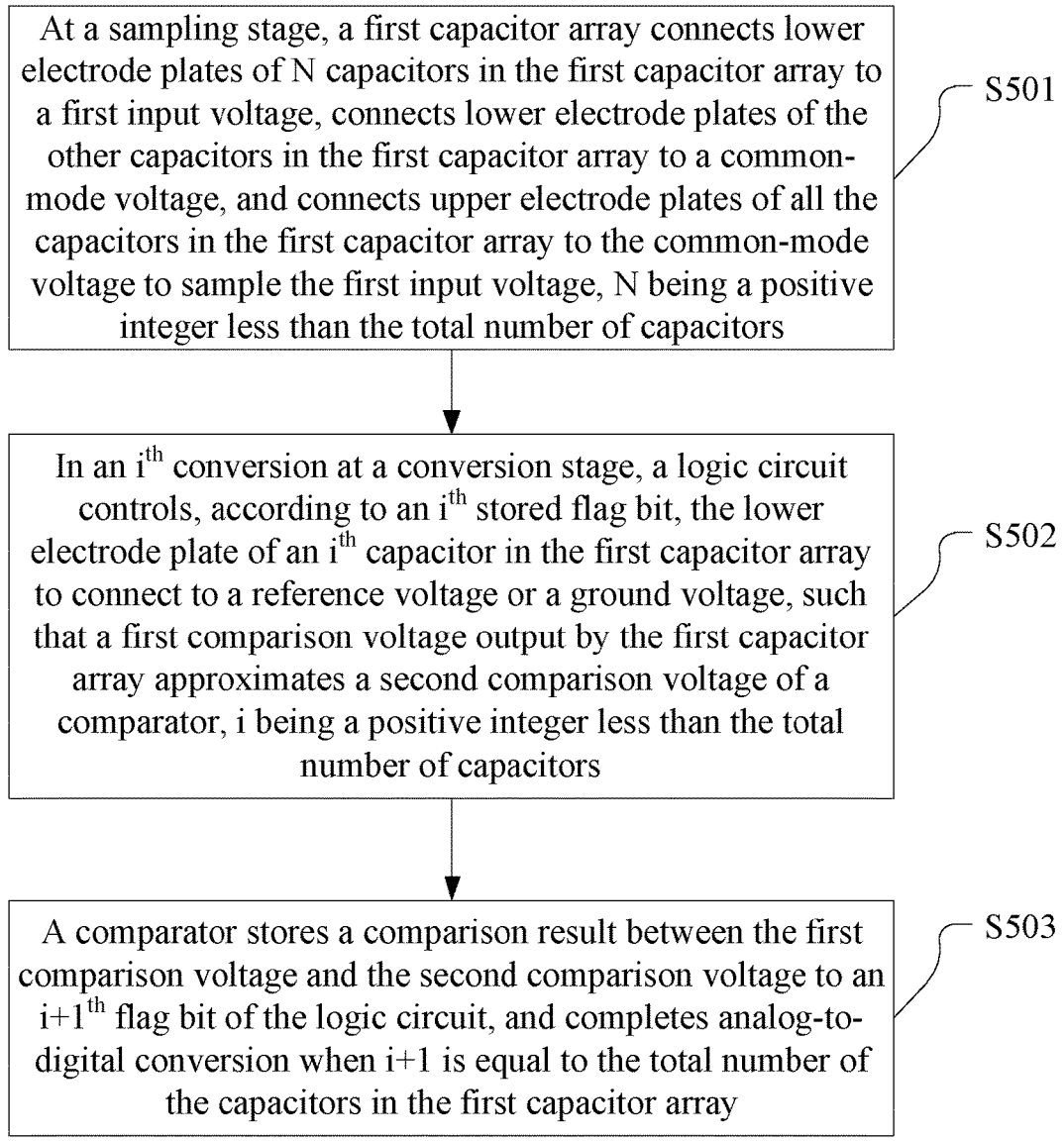
FIG. 5 is a schematic flowchart of a successive approximation analog-to-digital conversion method according to an embodiment of the present application.

FIG. 5 is a schematic flowchart of a successive approximation analog-to-digital conversion method. As illustrated in FIG. 5, the method includes the following steps:

S501: at a sampling stage, connecting, by a first capacitor array, lower electrode plates of N capacitors to a first input voltage, connecting lower electrode plates of the other capacitors to a common-mode voltage, and connecting upper electrode plates of all the capacitors to the common-mode voltage to sample the first input voltage, N being a positive integer less than the total number of capacitors;

S502: in an $i^{th}$ conversion at a conversion stage, controlling, by a logic circuit according to an $i^{th}$ stored flag bit, the lower electrode plate of an $i^{th}$ capacitor in the first capacitor array to connect to a reference voltage or a ground voltage, such that a first comparison voltage output by the first capacitor array approximates a second comparison voltage of a comparator, i being a positive integer less than the total number of capacitors; and S503: storing, by the comparator, a comparison result between the first comparison voltage and the second comparison voltage to an $i+1^{th}$ flag bit in the logic circuit, and completing analog-to-digital conversion when i+1 is equal to the total number of capacitors in the first capacitor array.

The method according to this embodiment may be performed by the circuit in the embodiment as illustrated in FIG. 2 and the steps are similar, which are thus not described herein any further.

Figure 6:
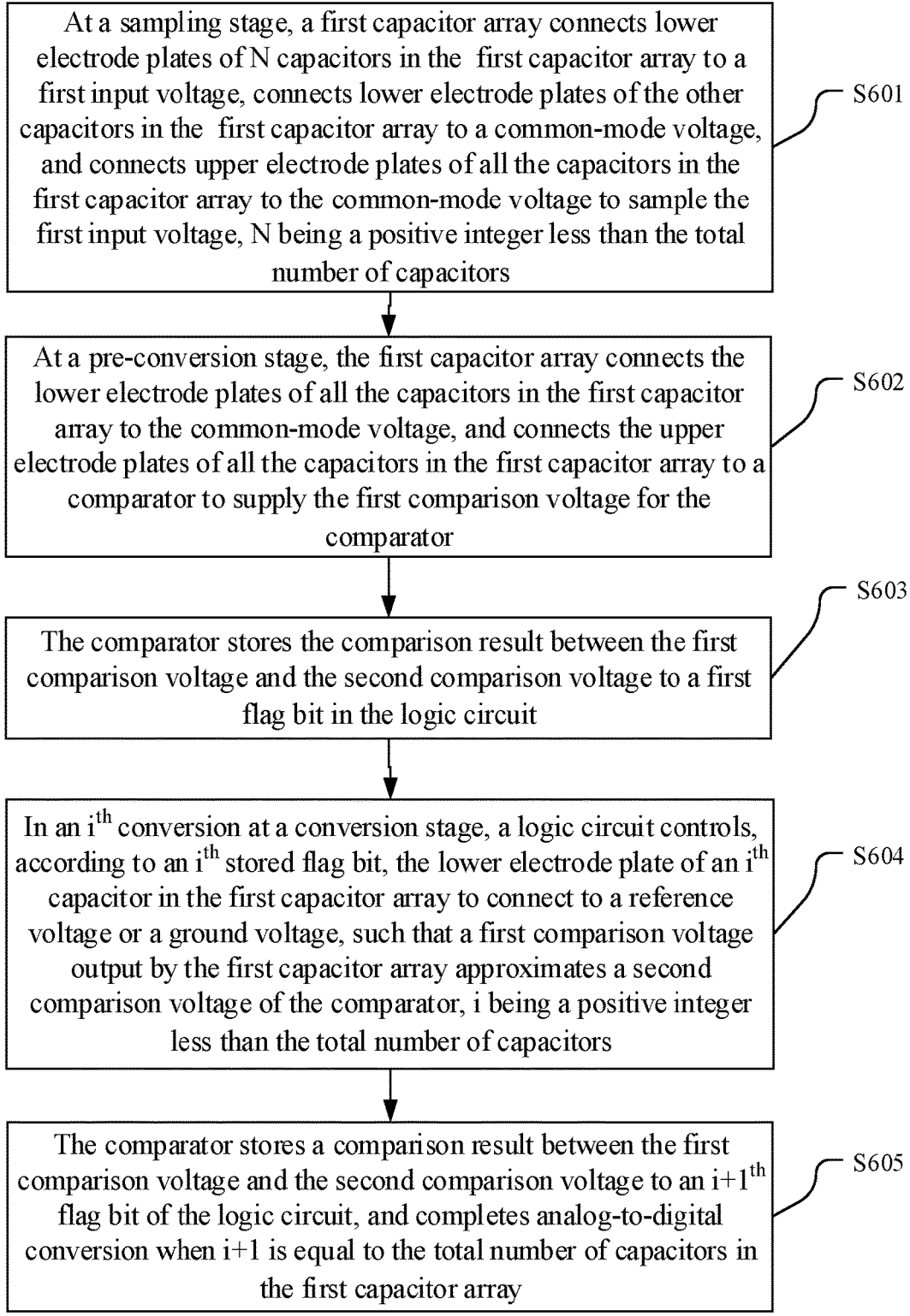
FIG. 6 is a schematic flowchart of another successive approximation analog-to-digital conversion method according to an embodiment of the present application.

FIG. 6 is a schematic flowchart of a successive approximation analog-to-digital conversion method. As illustrated in FIG. 6, the method includes the following steps:

S602: at a pre-conversion stage, connecting, by the first capacitor array, the lower electrode plates of all the capacitors to the common-mode voltage, and connecting the upper electrode plates of all the capacitors to the comparator to supply a first comparison voltage for the comparator; and S603: storing, by the comparator, the comparison result between the first comparison voltage and the second comparison voltage to a first flag bit in the logic circuit.

Steps S601, S604 and S605 respectively correspond to steps S501, S502 and S503 in the embodiment as illustrated in FIG. 5, which are thus not described herein any further.

The method according to this embodiment may be performed by the circuit in the embodiment as illustrated in FIG. 2 and the steps are similar, which are thus not described herein any further.

Figure 7:
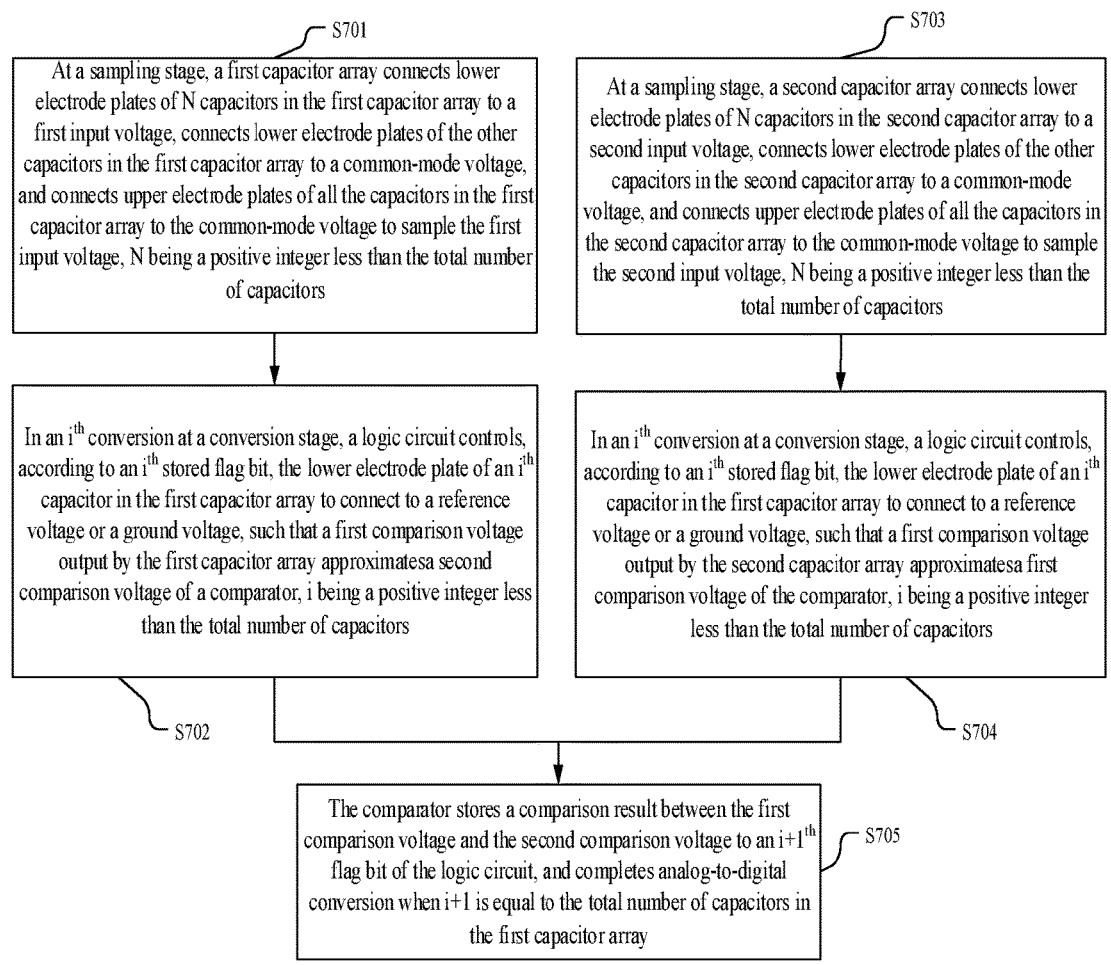
FIG. 7 is a schematic flowchart of another successive approximation analog-to-digital conversion method according to an embodiment of the present application.

FIG. 7 is a schematic flowchart of a successive approximation analog-to-digital conversion method. As illustrated in FIG. 7, the method includes the following steps:

5703: at the sampling stage, connecting, by a second capacitor array, lower electrode plates of N capacitors to a second input voltage, connecting upper electrode plates of all the capacitors to the common-mode voltage to sample the second input voltage, the N capacitors being corresponding to the N capacitors in the first capacitor array; and 5704: in the $i^{th}$ conversion at the conversion stage, the logic circuit is configured to control, according to the $i^{th}$ stored flag bit, the lower electrode plate of an $i^{th}$ capacitor in the second capacitor array to connect to a reference voltage or a ground voltage, such that the second comparison voltage approximates the first comparison voltage.

Steps S701, S702 and S705 respectively correspond to steps S501, S502 and S503 in the embodiment as illustrated in FIG. 5, which are thus not described herein any further.

The method according to this embodiment may be performed by the circuit in the embodiment as illustrated in FIG. 3 and the steps are similar, which are thus not described herein any further.

A person skilled in the art shall understand that the embodiments may be described to illustrate methods, apparatuses (devices), or computer program products. Therefore, hardware embodiments, software embodiments, or hardware-plus-software embodiments may be used to illustrate the embodiments of the present application. In addition, the embodiments of the present application may further employ a computer program product which may be implemented by at least one non-transitory computer-readable storage medium with an executable program code stored thereon. The non-transitory computer-readable storage medium comprises but not limited to a disk memory, a CD-ROM, and an optical memory.

The embodiments of the present application are described based on the flowcharts and/or block diagrams of the method, apparatus (device), and computer program product according to the embodiments of the present application. It should be understood that each process and/or block in the flowcharts and/or block diagrams, and any combination of the processes and/or blocks in the flowcharts and/or block diagrams may be implemented using computer program instructions. These computer program instructions may be issued to a computer, a dedicated computer, an embedded processor, or processors of other programmable data processing device to generate a machine, which enables the computer or the processors of other programmable data processing devices to execute the instructions to implement an apparatus for implementing specific functions in at least one process in the flowcharts and/or at least one block in the block diagrams.

These computer program instructions may also be stored a non-transitory computer-readable memory capable of causing a computer or other programmable data processing devices to work in a specific mode, such that the instructions stored on the non-transitory computer-readable memory implement a product comprising an instruction apparatus, wherein the instruction apparatus implements specific functions in at least one process in the flowcharts and/or at least one block in the block diagrams.

These computer program instructions may also be stored on a computer or other programmable data processing devices, such that the computer or the other programmable data processing devices execute a series of operations or steps to implement processing of the computer. In this way, the instructions, when executed on the computer or the other programmable data processing devices, implement the specific functions in at least one process in the flowcharts and/or at least one block in the block diagrams.

Although preferred embodiments of the present application are described, those skilled in the art may make modifications and variations to these embodiments based on the basic inventive concept of the present application. Therefore, the appended claims are interpreted as covering the preferred embodiments and all such modifications and variations falling within the protection scope of the embodiments of the present application. Apparently, a person skilled in the art may make various modifications and variations to the present application without departing from the spirit and principles of the present application. If such modifications and variations fall within the scope defined by the claims of the present application and equivalent technologies thereof, the present application is intended to cover such modifications and variations.

What is claimed is:

1. An analog-to-digital conversion circuit, comprising a first capacitor array, a logic circuit and a comparator; wherein:

at a sampling stage, the first capacitor array is configured to connect lower electrode plates of N capacitors in the first capacitor array to a first input voltage, connect lower electrode plates of the other capacitors in the first capacitor array to a common-mode voltage, and connect upper electrode plates of all capacitors in the first capacitor array to the common-mode voltage to sample the first input voltage, wherein N is a positive integer less than a total number of the capacitors in the first capacitor array;

in an $i^{th}$ conversion at a conversion stage, the logic circuit is configured to control, according to an $i^{th}$ stored flag bit, the lower electrode plate of an $i^{th}$ capacitor in the first capacitor array to connect to a reference voltage or a ground voltage, such that a first comparison voltage output by the first capacitor array approximates a second comparison voltage, wherein i is a positive integer less than the total number of the capacitors in the first capacitor array; and the comparator is configured to store a comparison result between the first comparison voltage and the second comparison voltage to an $i+1^{th}$ flag bit in the logic circuit, and analog-to-digital conversion is completed when i+1 is equal to the total number of the capacitors in the first capacitor array.

2. The circuit according to claim 1, further comprising:
at a pre-conversion stage, the first capacitor array is configured to connect the lower electrode plates of all the capacitors to the common-mode voltage, and connect the upper electrode plates of all the capacitors in the first capacitor array to the comparator to supply the first comparison voltage to the comparator, wherein the pre-conversion stage is between the sampling stage and a first conversion at the conversion stage; and
the comparator is configured to store the comparison result between the first comparison voltage and the second comparison voltage to a first flag bit in the logic circuit.

3. The circuit according to claim 1, wherein the comparator is connected to the common-mode voltage to use the common-mode voltage as the second comparison voltage.

4. The circuit according to claim 1, wherein the flag bit stored in the logic circuit takes a value of 0 or 1.

5. The circuit according to claim 4, wherein the controlling, by the logic circuit according to an $i^{th}$ stored flag bit, the lower electrode plate of an $i^{th}$ capacitor in the first capacitor array to connect to a reference voltage or a ground voltage comprises:
if the flag bit is 1, connecting the lower electrode plate of the $i^{th}$ capacitor in the first capacitor array to the ground voltage; and
if the flag bit is 0, connecting the lower electrode plate of the $i^{th}$ capacitor in the first capacitor array to the reference voltage.

6. The circuit according to claim 4, wherein the comparator is specifically configured to define the comparison result to 1 if the first comparison voltage is greater than the second comparison voltage, and define the comparison result to 0 if the first comparison voltage is not greater than the second comparison result.

7. The circuit according to claim 1, wherein the common-mode voltage is an average value of the reference voltage and the ground voltage.

8. The circuit according to claim 1, wherein the logic circuit is a shift register.

9. The circuit according to claim 1, wherein the value of N is defined according to a value range of the first input voltage.

10. The circuit according to claim 1, wherein the first capacitor array is a binary capacitor array or a non-binary capacitor array.

11. The circuit according to claim 1, further comprising a second capacitor array; wherein
at the sampling stage, the second capacitor array is configured to connect lower electrode plates of N capacitors in the second capacitor array to a second input voltage, connect lower electrode plates of the other capacitors in the second capacitor array to a common-mode voltage, and connect upper electrode plates of all the capacitors in the second capacitor array to the common-mode voltage to sample the second input voltage, wherein the N capacitors in the second capacitor array correspond to the N capacitors in the first capacitor array; and
in the $i^{th}$ conversion at the conversion stage, the logic circuit is configured to control, according to the $i^{th}$ stored flag bit, the lower electrode plate of an $i^{th}$ capacitor in the second capacitor array to connect to a reference voltage or a ground voltage, such that the second comparison voltage approximates the first comparison voltage.

12. The circuit according to claim 11, wherein at the pre-conversion stage, the second capacitor array is configured to connect the lower electrode plates of all the capacitors to the common-mode voltage, and the upper electrode plates of all the capacitors in the second capacitor array are connected to the comparator to supply the second comparison voltage for the comparator.

13. The circuit according to claim 11, wherein the control, by the logic circuit according to an $i^{th}$ stored flag bit, the lower electrode plate of an $i^{th}$ capacitor in the second capacitor array to connect to a reference voltage or a ground voltage comprises:
if the flag bit is 1, connecting the lower electrode plate of the $i^{th}$ capacitor in the second capacitor array to the reference voltage;
if the flag bit is 0, connecting the lower electrode plate of the $i^{th}$ capacitor in the second capacitor array to the ground voltage.

14. An analog-to-digital conversion method, comprising:
at a sampling stage, connecting, by a first capacitor array, lower electrode plates of N capacitors in the first capacitor array to a first input voltage, connecting lower electrode plates of the other capacitors in the first capacitor array to a common-mode voltage, and connecting upper electrode plates of all capacitors in the first capacitor array to the common-mode voltage to sample the first input voltage, wherein N is a positive integer less than a total number of all the capacitors in the first capacitor array;
in an $i^{th}$ conversion at a conversion stage, controlling, by a logic circuit according to an $i^{th}$ stored flag bit, the lower electrode plate of an $i^{th}$ capacitor in the first capacitor array to connect to a reference voltage or a ground voltage, such that a first comparison voltage output by the first capacitor array approximates a second comparison voltage of a comparator, wherein i is a positive integer less than the total number of all the capacitors in the first capacitor array; and
storing, by the comparator, a comparison result between the first comparison voltage and the second comparison voltage to an $i+1^{th}$ flag bit in the logic circuit, and completing analog-to-digital conversion when i+1 is equal to the total number of the capacitors in the first capacitor array.

15. The method according to claim 14, further comprising:
at a pre-conversion stage, connecting, by the first capacitor array, the lower electrode plates of all the capacitors in the first capacitor array to the common-mode voltage, and connecting the upper electrode plates of all the capacitors in the first capacitor array to the comparator to supply the first comparison voltage for the comparator; and
storing, by the comparator, the comparison result between the first comparison voltage and the second comparison voltage to a first flag bit in the logic circuit.

16. The method according to claim 14, further comprising:
at the sampling stage, connecting, by a second capacitor array, lower electrode plates of N capacitors in the second capacitor array to a second input voltage, connecting lower electrode plates of the other capacitors in the second capacitor array to a common-mode voltage, and connecting upper electrode plates of all the capacitors in the second capacitor array to the common-mode voltage to sample the second input voltage, wherein the N capacitors in the second capacitor array correspond to the N capacitors in the first capacitor array; and in the $i^{th}$ conversion at the conversion stage, controlling, by the logic circuit according to the $i^{th}$ stored flag bit, the lower electrode plate of an $i^{th}$ capacitor in the second capacitor array to connect to a reference voltage or a ground voltage, such that the second comparison voltage approximates the first comparison voltage.

* * * * *